United States Patent [19]
Trumper et al.

[11] Patent Number: 5,699,621
[45] Date of Patent: Dec. 23, 1997

[54] POSITIONER WITH LONG TRAVEL IN TWO DIMENSIONS

[75] Inventors: David L. Trumper, Plaistow; Mark E. Williams, Pelham, both of N.H.

[73] Assignee: Massachusetts Institute of Technology, Cambridge, Mass.

[21] Appl. No.: 604,733

[22] Filed: Feb. 21, 1996

[51] Int. Cl.$^6$ ............... G01B 7/00; B25H 1/00; B23Q 16/00
[52] U.S. Cl. ............... 33/1 M; 33/568; 33/573; 33/DIG. 1
[58] Field of Search ............... 33/1 M, 708, 568, 33/569, 573, DIG. 1

[56] References Cited

U.S. PATENT DOCUMENTS

| | | | |
|---|---|---|---|
| 3,377,711 | 4/1968 | Wempe | 33/573 |
| 4,575,942 | 3/1986 | Moriyama | 33/1 M |
| 4,676,649 | 6/1987 | Phillips | 33/1 M |
| 5,105,552 | 4/1992 | Bielle | 33/1 M |
| 5,142,791 | 9/1992 | Kobayashi et al. | 33/1 M |
| 5,326,335 | 7/1994 | Takei | 33/1 M |

*Primary Examiner*—Christopher W. Fulton
*Attorney, Agent, or Firm*—Wolf, Greenfield & Sacks, P.C.

[57] ABSTRACT

A precision positioning system is provided which provides long travel in two of the linear dimensions, while using non-contact bearings for both a first subassembly which provides long travel in one of the linear dimension and a second subassembly which provides long travel in the second linear dimension. The first or upper subassembly is preferably a magnetic subassembly which, in addition to providing long travel, also compensates or positions in three rotary dimensions and in the third linear dimension. The second subassembly is preferably either an air bearing or magnetic subassembly and is normally used only to provide long travel. Angled surfaces may be provided for magnetic bearings and capacitive or other gap sensing probes may be mounted to the stage and ground flush with the bearing actuators to provide more precise gap measurements.

32 Claims, 13 Drawing Sheets

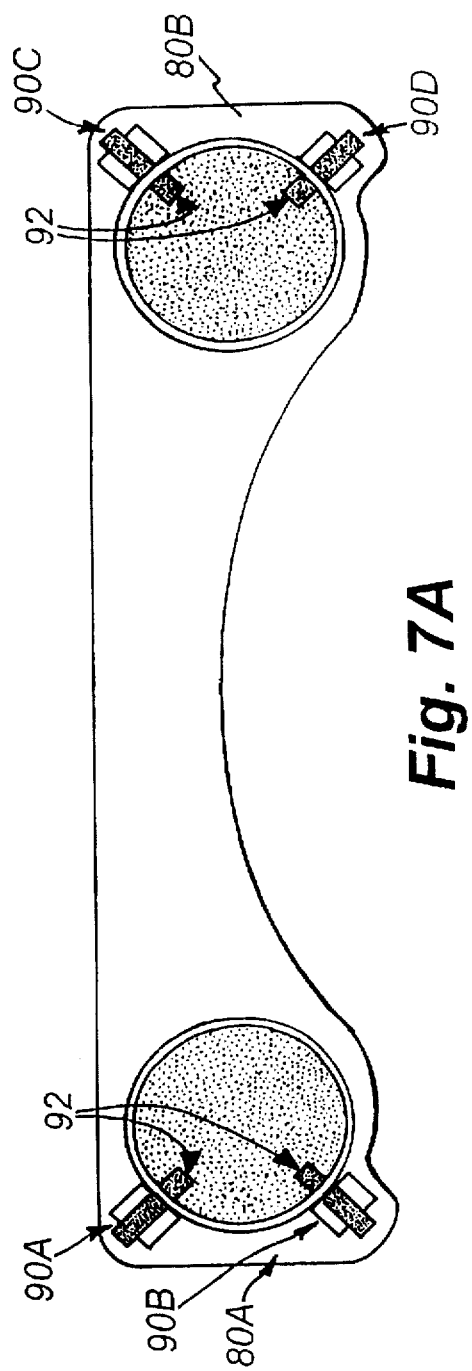
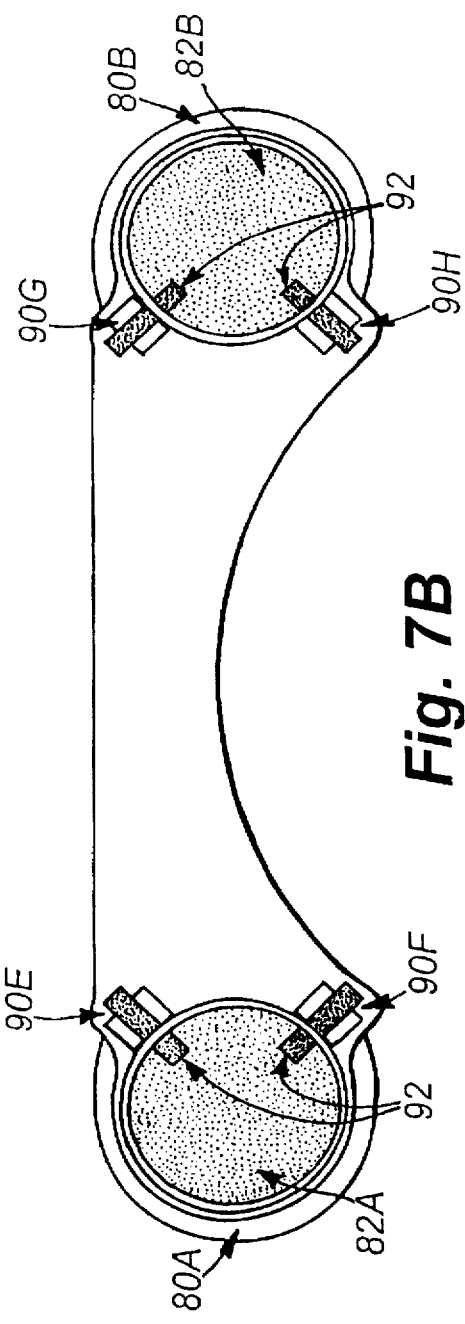
Fig. 7A
Fig. 7B

5,699,621

POSITIONER WITH LONG TRAVEL IN TWO DIMENSIONS

FIELD OF THE INVENTION

This invention relates to systems for precisely positioning a stage, and more particularly to such a system which provides precise positioning, normally in three linear and three rotary dimensions, with long travel being provided in two of the linear dimensions.

BACKGROUND OF THE INVENTION

There are numerous applications in science, industry, medicine and other fields where a requirement exists for precise multi-dimensional positioning of a stage on which a work piece may be mounted, with positioning in three linear dimensions and three rotary dimensions frequently being required. An example of such applications is the fabrication of semiconductor chips or other microparts using photolithographic techniques. For such applications, movements of only a few hundred microns, for example three hundred microns, may be required in one linear dimension, and small angular movements in the range of 1 to 2 milliradians, may be all that is required in the rotary dimensions; however, there is an increasing need to be able to provide long travel in the two linear dimensions parallel to the plane of the stage. For purposes of this discussion, long travel will be considered to be travel over a distance in excess of roughly one inch, with twelve inches being a typical value for long travel movement.

Heretofore, such systems have utilized two levels or subassemblies, with an upper subassembly to which the stage is mounted, which may be a mechanical or magnetic subassembly, moving the stage in one of the long dimensions, and the first subassembly being mounted to a second mechanical subassembly for moving the stage in the second long dimension. Mechanical subassemblies for either the first or second subassembly are undesirable for a number of reasons. First, even with high quality bearings, there is significant friction for any mechanical subassembly which increases the energy required to drive the subassembly. Further, this friction causes (a) difficulties in precision positioning, (b) wear which results in expensive maintenance and replacement costs, and (c) small pieces of metal or other material which wear off the mechanical bearings and other parts contaminating the environment in which the system is being utilized. The latter is a particular problem in applications such as semiconductor manufacture which may need to be conducted in a clean room environment. While air bearings overcome many of these problems, air bearings are restricted to travel in a single plane, and therefore cannot allow adjustments for out-of-plane degrees of freedom. Air bearings are also not suitable for use in low pressure or vacuum environments.

Another problem with existing positioning systems is size and weight. In particular, it is desirable that it be possible to move the stage so as to bring all points on the stage adjacent to a given point without excessive size of the system so as to provide as small a system package as possible, this being particularly important in applications such as clean room environments where space is scarce and/or expensive. It is also desirable to keep the mass of the stage to a minimum while providing all required functions. This minimizes electric current required to operate the system and also reduces the forces required to accelerate/decelerate the stage, thus facilitating rapid movement to a desired precise position. Typically, this involves using permanent magnets to support most of the weight of the stage where magnetic bearings are otherwise used and keeping the mass of the stage and of the first subassembly of the positioner as low as possible.

Another potential problem in positioners of this type is in precisely measuring gaps in the bearings so as to be able to determine when movement is required to return to or reach a desired position, the amount of such movement, and when a desired position has been reached. Various sensors including capacitive probes, inductive probes, linear variable differential transformers, linear scales, laser interferometers and other optical detectors have typically been used for this purpose. Mounting these sensors to the stator or housing rather than to the stage is considered advantageous since it avoids the need for connecting wires to a moving stage, such wires presenting potential force disturbances, mechanical and electrical noise and other problems. However, since these sensors measure the gap at the sensor, not the bearing, and since gap spacing may not be uniform, this may result in slight differences between the gaps detected by the sensors and the actual gaps for the bearing magnets or electromagnets, a difference which may create errors in some situations. Further, to detect angular positions in the rotary dimensions, two probes or other sensors which are spaced from each other, preferably by a significant distance such as five inches, are required. For long travel dimensions where the stage may for example be moved by twelve inches or more, this either requires that a large number of sensors be spaced along the travel path in order to always have two spaced sensors adjacent to the stage, or that a very long stage be used, something which is not generally practical. It would therefore be preferable if the sensors could be mounted to the stage along with the electromagnets so as to be measuring precisely the same gap being seen by the electromagnets. This would also provide two spaced sensors to make gap measurements along the entire travel path of the stage while providing the desired spacing between the sensors and assuring that the sensors always sense the stage spacing at the same points along the stage.

It is also desirable that there be only three bearings providing position control for each subassembly so that the subassembly is not overconstrained, resulting in undesirable stresses on the stage or other system components.

A need therefore exists for an improved positioner system providing long travel in two dimensions without requiring mechanical contact for any subassembly, and providing precise gap sensing with a minimum number of sensors (i.e. one sensor for each degree of freedom), in a stable, kinematically constrained configuration and with high efficiency.

SUMMARY OF THE INVENTION

In accordance with the above, the invention provides a system for precisely positioning a stage or platform in multiple dimensions, and in particular in three linear and three rotary dimensions, with long travel in two of the linear dimensions. The invention includes a first magnetic subassembly for moving the stage to a selected position in a first one of the linear dimensions for which there is long travel, for positioning the stage in the three rotary dimensions, and for positioning the stage in at least one of the other linear dimensions. A second subassembly is also provided for moving the first subassembly, including the stage which is mounted to the first subassembly, to a selected position in the second one of the linear dimensions for which there is long travel. The drive and bearing elements for the second subassembly are non-contact elements so there is substantially no physical contact between elements of the first subassembly and elements of the second subassembly which move relative to each other. For preferred embodiments, the non-contact bearings for the second subassembly are either air bearings or magnetic bearings. Where air bearings are utilized, there may be an air bearing at each end of the first subassembly or there may be an air bearing at only one end of the first subassembly, with the other end being unconstrained. Where magnetic bearings are utilized, the magnetic bearings for at least one of the subassemblies each contain at least two electromagnets which are mounted at angles such that the electromagnets provide equal forces in the same direction in a plane parallel to the plane of the stage and equal but opposite force in a plane perpendicular to the plane of the stage. For some embodiments, the bearings are mounted at a 45° angle. The bearings may also include at least one permanent magnet angled at substantially the same angle as one of the electromagnets of the bearing, the permanent magnets supporting at least a selected portion of the unloaded or static weight of the stage. For at least some embodiments, the angle of the electromagnets are such that the forces in the direction perpendicular to the plane of the stage are greater than the forces in the parallel direction. The electromagnets for the bearings of the first subassembly may be selectively energized to make fine position adjustments for the stage in the five dimensions for which the first subassembly does not provide long travel. For systems having a magnetic second subassembly, the electromagnets for the bearings of this subassembly may also be selectively energized to make fine position adjustments for the five dimensions for which this subassembly does not provide long travel. Thus, short adjustments may be made by either of the subassemblies, but are preferably made by the first subassembly. For preferred embodiments, there are three bearings for each subassembly in order to avoid overconstraining the subassembly, and coupling elements may be positioned at one or more selected locations along the bearing for at least the second subassembly to damp vibrations, decouple the subassemblies and enhance stability. Such coupling elements may take the form of extra electromagnetic or air bearing elements as appropriate. Decoupling of the stages and vibration damping may also be accomplished by generating a controllable vertical force with respect to a fixed base for both damping vibrations of the rail and to provide vertical positioning control for the stage. This may, for example, be accomplished by the first subassembly including at least three actuators, each of which extends from the underside of the stage and extends under the rail so as to fit between the rail and the fixed base. A magnetic element at the top of each actuator coacts with a corresponding magnetic element in the underside of the rail to generate the controlled force and electromagnetic elements in the bottom of each actuator coact with magnetic means forming at least a part of the base to generate the vertical forces with respect to the base.

For some embodiments, there are two substantially parallel rails provided for each subassembly, with the rails of the first subassembly each being sized and shaped to fit, with a selected clearance, in a corresponding one of a pair of spaced parallel tubes associated with the stage, and the rails for the second subassembly each being sized and shaped to fit, with a selected clearance in a corresponding one of a pair of spaced parallel tubes associated with the first subassembly. Each of the tubes has at its ends at least two electromagnetic bearing elements, with each corresponding rail having targets formed therein for each bearing element. A co-acting pair of electromagnetic linear drive elements are also formed respectively on the inner surface of each tube and the outer surface of each rail, with the drive elements on the rails being on the portion thereof overridden by the corresponding tube. For some embodiments, there are two electromagnet bearing elements at the end of each tube, which elements are mounted at an angle to the plane of the stage so as to provide forces in a direction parallel to and in a direction perpendicular to the plane of the stage. The electromagnetic linear drive elements for each subassembly include an array of permanent magnets on the inner surface of each tube and a short length of electrical windings on the outer surface of each rail, with the array of permanent magnets for each tube being a Halbach array (as hereinafter discussed) for preferred embodiments. In other embodiments, the coil may be longer than the magnets, or the locations of the coils and magnets may be exchanged. For some embodiments the rails and tube are cylindrical, having a circular cross-section, while for other embodiments the rails and tubes have a square or other rectangular cross-section. Depending on application, other cross-sectional shapes may also be possible for the rails and tubes.

For preferred embodiments, a capacitive probe, inductive probe, eddy current probe or other suitable gap sensor is mounted in at least selected ones of the electromagnetic bearings. The probe may be mounted in at least selected ones of the electromagnets with a measuring face of the probe being flush with the bearing surface of the magnet. The probes for the first subassembly are mounted to the stage and circuitry is included on the stage to process electrical outputs from each probe mounted thereon so that the resulting signal is not affected by cable flexing or cable length.

Each subassembly also includes a linear motor for moving the subassembly in its long travel dimension. For preferred embodiments, the linear motors are electromagnetic motors having a permanent magnet array mounted to the moving member (i.e. the stage for the first subassembly and the first subassembly for the motor of the second subassembly), with windings mounted to the other member for each subassembly in a position adjacent to corresponding permanent magnet array. For preferred embodiments, the permanent magnet array for the electromagnetic motors are Halbach arrays. For some embodiments, in order to reduce mass, the windings for the electromagnetic motor of the first subassembly are wound on a vertical projection from the stationary member for the subassembly, with the permanent magnet array for the stage being in two sections, one of which sections is mounted on either side of the vertical projection.

The foregoing and other objects, features and advantages of the invention will be apparent from the following more particular description of preferred embodiments of the invention as illustrated in the accompanying drawings.

IN THE DRAWINGS

FIGS. 7A and 7B are front outboard views taken along the line 7—7 in FIG. 6 for an outboard actuator and an inboard actuator embodiment, respectively, for the positioner embodiment shown in FIG. 6.

DETAILED DESCRIPTION

Figure 1:
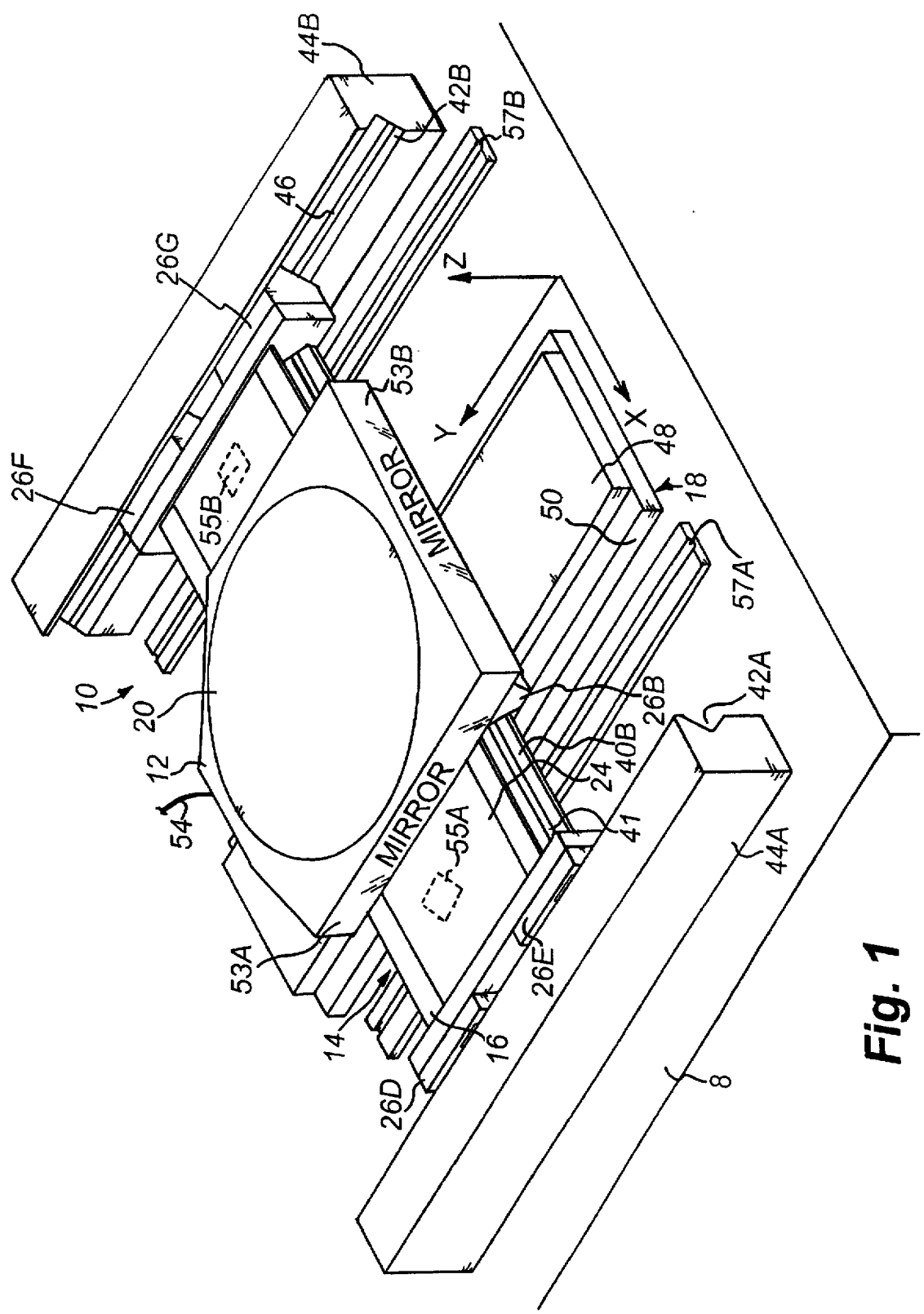
FIG. 1 is a top-front perspective view of a positioning system in accordance with a first embodiment of the invention.
Figure 2:
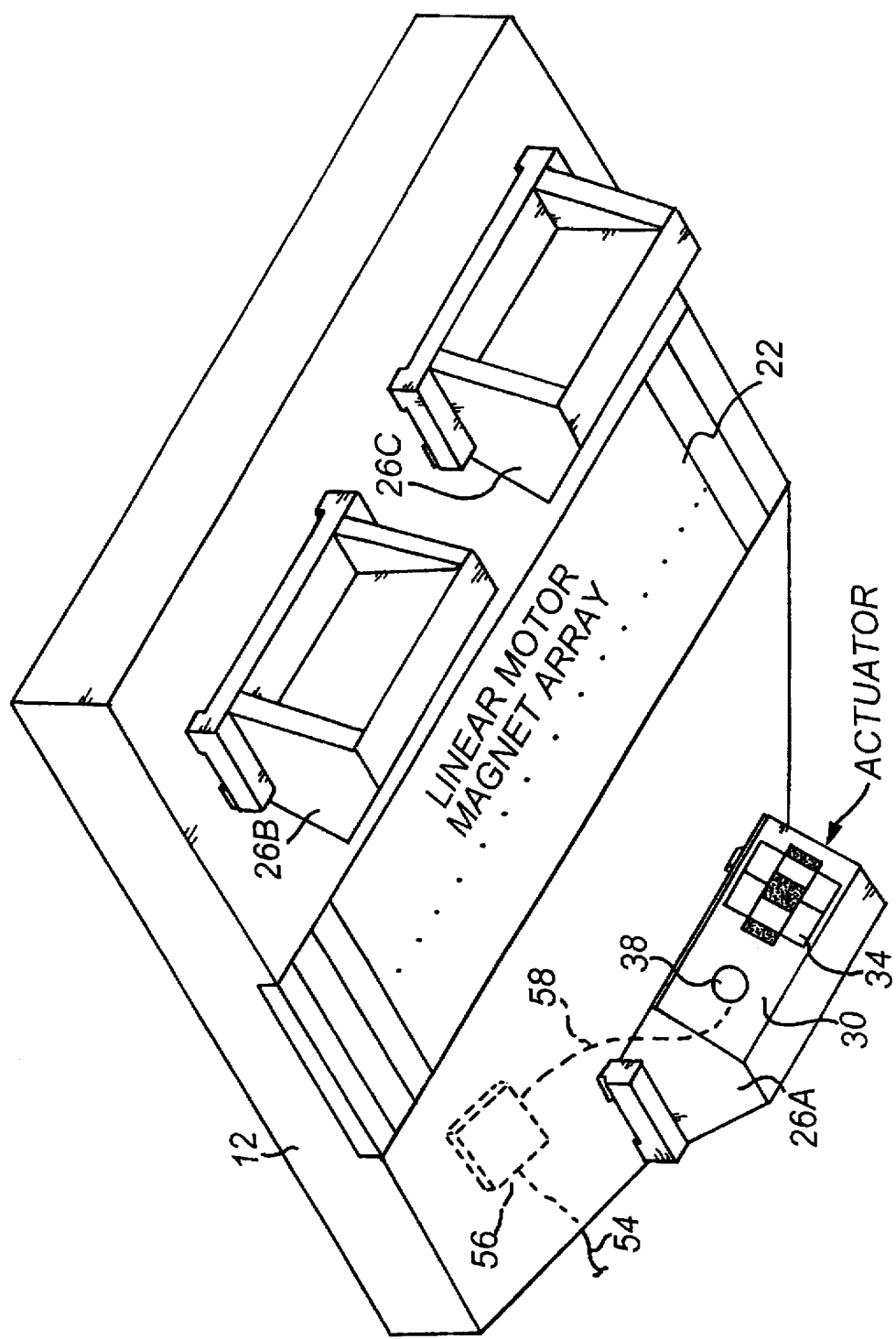
FIG. 2 is a bottom perspective view of the platform or stage for the positioning system shown in FIG. 1.
Figure 3:
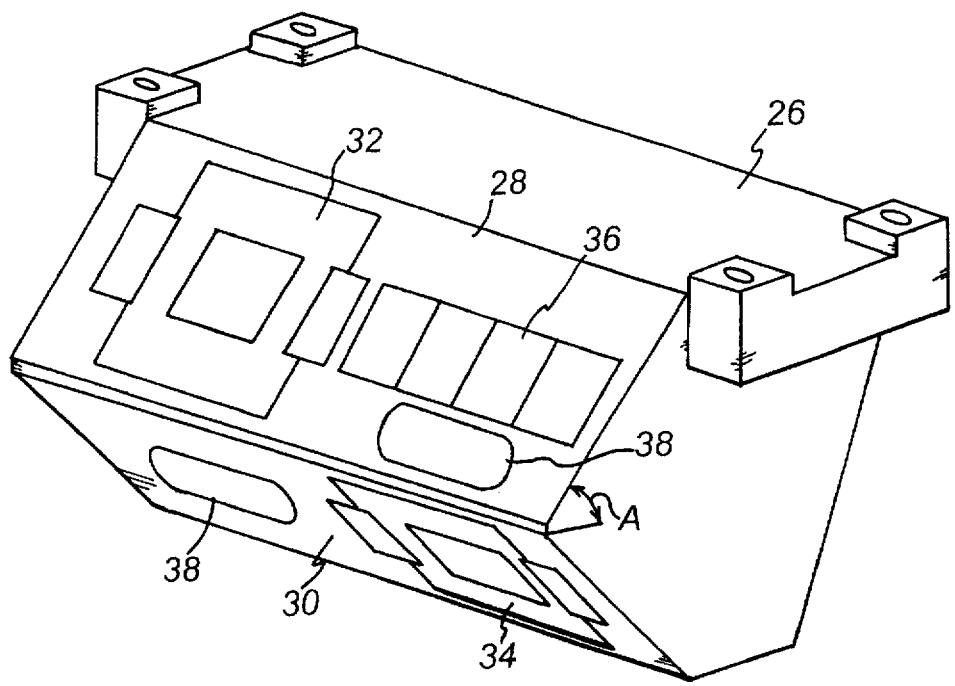
FIG. 3 is a perspective view for a bearing actuator of the type used in the embodiment of FIG. 1.
Figure 4:
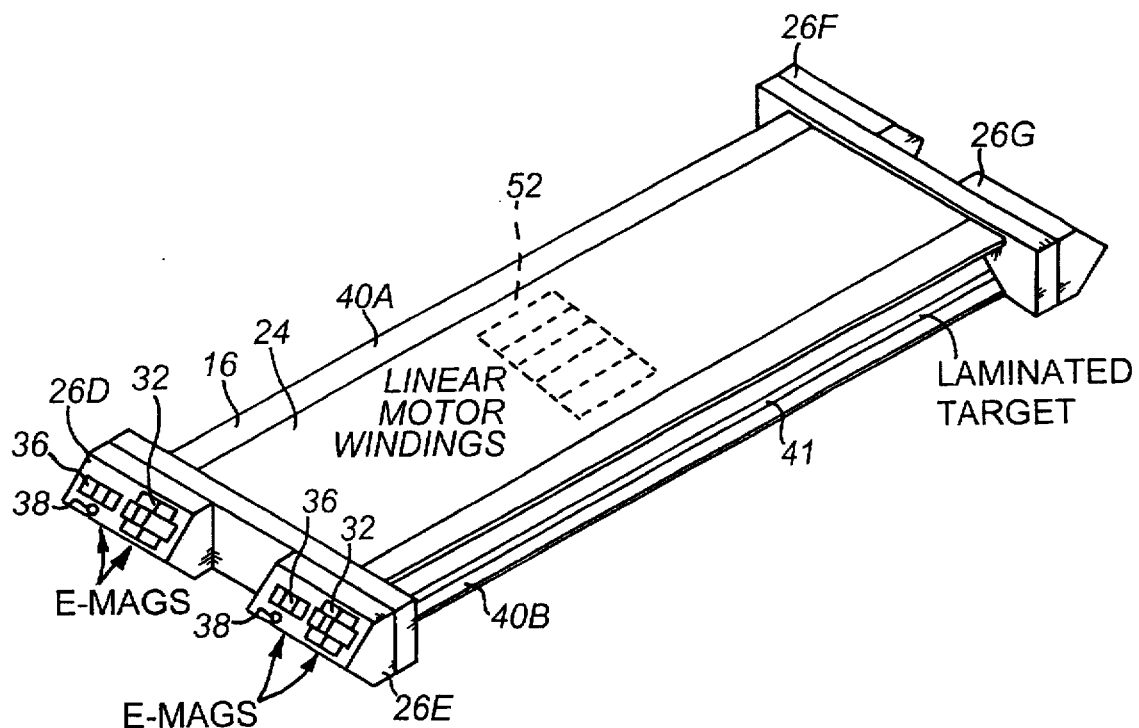
FIG. 4 is a top perspective view of a rail assembly suitable for use as a rail for the first subassembly of the system shown in FIG. 1.

Referring to FIG. 1, a positioning system 10 is shown for a platform or stage 12. The system includes a first subassembly 14 for moving stage 12 in the x direction on a rail 16 and a second subassembly 18 for moving the rail 16, and the stage 12 mounted thereto in the y direction. A semiconductor wafer 20 or other work-piece may be mounted on stage 12 to be positioned by the system. Referring also to FIGS. 2 and 4, it is seen that the first subassembly includes a linear motor for moving the stage subassembly in the x direction, the linear motor including a linear magnetic array 22 mounted to the underside of stage 12 which overlies electrical windings 24 formed on the upper surface of rail 16. Stage 12 also has three magnetic bearing actuators 26A–26C mounted to its underside, with two of the actuators positioned adjacent each other on one side of linear array 22 and the other actuator, actuator 26A, positioned on the other side of the array. As may be best seen in FIG. 3, each actuator 26 has an upper bearing face 28 and a lower bearing face 30. One or more electromagnets 32, 34 are mounted flush with bearing faces or surfaces 28 and 30, respectively. Bearing face 28 also has one or more permanent magnets 36 (four magnets are shown in FIG. 3) mounted therein. Finally, for preferred embodiments, a capacitive probe 38 is mounted in at least some of the bearing surfaces, which probes are ground along with electromagnets 32 and 34 to be flush with the corresponding surface. While for the embodiment of the invention shown in the figures, each of the surfaces 28 and 30 is at substantially a 45° angle (angle A) to the plane of stage 12, this is not a limitation on the invention, and other angles may be preferred for some applications. In particular, since as will be discussed later, electromagnets 32 and 34 are utilized in part to support the weight of stage 12 and to support the weight of any work-piece 20 mounted thereon, in order to reduce the electrical energy required for performing this function, it may in some applications be desirable for the angles A to be reduced so as to provide a larger component of lift force for the same amount of electrical energy.

The bearing faces of actuators 26B and 26C fit in a bearing channel 40B formed in rail 16, which channel has a pair of angled walls which are at the same angles as those for surfaces 28 and 30 of the bearings. A channel 40A is provided on the opposite side of rail 16 in which bearing 26A fits. A ferrous bearing target 41 is formed in each angled surface of each groove 40 at a position opposite the electromagnets 32, 34 for the corresponding actuators 26, with only the target 41 for one of the angled surfaces of groove 40B being shown in FIGS. 1 and 4.

Rail 16 has two actuators 26D, 26E mounted on one of its ends and two actuators 26F, 26G mounted on its other end. These actuators can be substantially the same as the actuators 26A–26C (as seen in FIG. 3) or may be different. Actuators 26D and 26E fit in an angled bearing groove 42A formed in a rail 44A while actuators 26F and 26G fit in bearing groove 42B formed in rail 44B. Each groove has ferrous bearing targets 46 formed in each of its angled surfaces in a position opposite that for electromagnets 32, 34 (with only a target 46 for the lower angled surface of groove 42B being shown in FIG. 1). The linear motor for the second subassembly is formed by windings 48 mounted on a support 50 and a linear permanent magnet array 52 (shown in dotted lines in FIG. 4) which is mounted to the underside of rail 16. At least two surfaces, for example side surfaces 53A and 53B, of stage 12 are mirrored and may be utilized in conjunction with a standard optical detector to detect the absolute position of the stage in at least the x and y directions. The manner of such detection is standard and does not form part of the present invention. The permanent magnet arrays for each of the linear motors are preferably Halbach arrays, such array being generally described, for example in ("Design of Permanent Multipole Magnets With Oriented Rare Earth Cobalt Material", Nuclear Instruments and Methods, Vol. 169, No. 1, pp. 1–10, 1980; and "Application of Permanent Magnets In Accelerators and Electron Storage Rings", Journal of Applied Physics, Vol. 57, No. 8 pp. 3605–3608, 1985).

Rail 16 also has electromagnets 55A–55B (shown in dotted lines in FIG. 1) mounted to its underside which coact with corresponding ferromagnetic targets 57A, 57B mounted to the system frame and controlled to apply downward forces to the rail at two points thereon. The number of points where these control forces are applied would vary with application and would generally be at antinodes for resonance of the rail. The control forces of electromagnets 55 and targets 57 are sufficient to stiffen rail 16, and thus to damp structural resonance of the rail and reduce subassembly interaction, but are not sufficient to cause contact therebetween or to cause contact at the bearings. Alternatively, selected positions or all of the support table 8 may be constructed of ferromagnetic materials to replace target 57A, 57B.

In operation, magnets 36 for actuators 26A–26C are selected so as to provide sufficient lift forces to substantially support the weight of stage 12 if a wafer or other work-piece 20 is not mounted thereon. The magnetic volume of the magnet for actuator 26A is substantially equal to the combined magnetic volume for the permanent magnets of actuators 26B and 26C, thereby assuring that the magnets do not create a bias in the y direction. To the extent capacitive probes 38 detect that the gap for the upper pair of surfaces for any of the bearings is greater than the gap for the corresponding lower surface (or greater than a selected value), the electromagnet for such bearing is energized by an amount to equalize or to adjust the selected value for such gaps in a manner known in the art. The electromagnets in this manner compensate for any weight of the stage which is not otherwise compensated for by the permanent magnets 36, or for excess lift, generated by the permanent magnets. Similarly, the permanent magnets 36 for the actuators 26D–26G substantially compensate for the static weight of the first subassembly, including the weight of the stage, with the remaining weight or excess lift of the first subassembly being compensated by the upper face electromagnets 32 and lower face electromagnets 34 of the actuators 26D–26G in the same manner as the corresponding electromagnets of the actuators 26A–26C compensated for the first subassembly. When a work-piece 20 is mounted on the stage, the small added weight of the work-piece is also compensated for by the upper and lower face electromagnets of each actuator in the same manner as these electromagnets compensate for excess weight of the stage itself. The electromagnets of the upper face and the electromagnets of the lower face may also be utilized to make slight adjustments in the z dimension for stage and work-piece positions up to the limits of the bearing spacing. For preferred embodiments, such movement may be up to 300 microns per face. It is preferable that such adjustments be made only in the upper subassembly 14 and not in lower subassembly 18. This is particularly true for the embodiment shown where the upper subassembly has only three bearings so as to not be overconstrained, while the lower subassembly has four bearings and is therefore potentially overconstrained.

Some rotational movements of, for example, up to three (3) milliradians may be made about each of the x, y and z axes by suitably actuating selected combinations of the electromagnets 32. For example, rotation about the y axis may be effected by a selected combination of the upper electromagnet for one of the actuators 26B, 26C and the lower electromagnet for the other of these actuators. Both electromagnets of actuator 26A would also need to be operated to compensate for the resulting forces in the y direction. Rotation about other axes could be effected by similar selected actuation of the electromagnets in a manner generally known in the art. Such rotational movements could be imparted either to compensate for slight rotations about one or more of the axes which occur inadvertently during operation to maintain a desired angular position for the stage, or to intentionally impart a slight angle in one of the dimensions to the stage for a particular operation. Gap sensing by the capacitive probes or other gap sensors is utilized by the system in a manner known in the art to detect undesired angular variations and/or to determine when movement to a desired angular orientation has occurred. While capacitive probes may be provided for each bearing surface 28, 30 of each bearing actuator 26, for each subassembly, a significantly lesser number of probes is required to control the required degrees of freedom. In particular, only five (5) probes are required for the upper subassembly and five (5) probes for the lower subassembly, the proper placement of such probes being known in the art.

Stage 12 may be moved to a desired linear position in the x direction or may be incrementally stepped in the x direction by applying currents to the windings 24 of the first subassembly linear motor in a manner known in the art. Speed of operation in achieving long travel is preferably enhanced by having the linear motor accelerate the stage quickly to a position near the desired position and then decelerate so as to minimize or eliminate overshoot as a desired position is approached. The approach of the stage toward a desired position is detected by an optical or other suitable detector. Stepping or long travel in the y direction is similarly accomplished by operation of the linear motor for the lower subassembly. For an embodiment where the positioner 10 is being utilized for semiconductor chip fabrication, the upper subassembly 14 is preferably utilized to scan the stage in the x direction, with the lower subassembly 18 being utilized to step the stage in the y direction at the end of each x direction scan.

The angled faces 28 and 30 for each actuator, and the corresponding angled bearing surfaces for each of the bearing grooves 40 and 42 provide a number of advantages. First, it permits control in all of the desired dimensions to be accomplished with two electromagnets per bearing actuator rather than three electromagnets per actuator as for previous actuators. This is because each electromagnet provides forces in two of the dimensions rather than in only a single dimension. While this advantage is slightly offset by somewhat greater complexity in the control circuitry, with modern computer controls this is a manageable problem. The second advantage is that the angled configuration may permit smaller gaps between the electromagnets and the targets for a given amount of movement. This is true where movements are at an angle to the gap rather than perpendicular to it. Thus, while a 300 micron gap would be required with a standard configuration in order to obtain movement of 300 microns in the z direction, movement of 300 microns in the z direction can be achieved with the bearings of this invention with a gap of 220 microns for a 45° configuration (assuming that there is not also movement in the X direction). Since force is inversely proportional to gap squared, this incremental reduction in gap, where usable, reduces actuator power consumption and/or permits greater movement for the same power consumption.

As discussed earlier, an advantage of having the capacitive or other sensor probes 38 mounted on the actuators 26 is that both the surface of the probe and of the corresponding electromagnet 34 may be ground simultaneously so that the gap detected by the probe is the same as the gap for the electromagnet. However, this requires that the probe be mounted to stage 12 and that the signals from the probe somehow be taken from the stage through a wire 54 to external control circuitry. But, as the stage moves, wire 54 is flexed, potentially creating electrical noise on the wire. Since the output levels from probes such as capacitive probes are typically quite weak, such noise may overwhelm the signal from the probe. However, this problem can be overcome by providing front end circuitry 56 (FIG. 2) mounted in the stage which performs first level processing on the signals from the probe, for example by comparing such signals against a reference and possibly amplifying the signals, so that the signals, while still analog, are at a sufficient level above noise, and are less susceptible to distortion from stray capacitance or changing cable capacitance so that they can be passed through cable 54 without interference. The probes 38 would be connected to circuit 56 by suitable lines 58. Power may be brought into circuit 56 through lines 54. The circuit itself could be made very light so as to result in an insignificant increase in the weight of the stage. Circuit 58 may also be designed to convert the probe information to digital form so as to achieve a further reduction in noise sensitivity.

Rails 44 and support 50 may be mounted on a table or other base 8 depending on application. The base on which the system 10 is mounted may itself be mounted on air legs or on other suitable anti-vibration devices to isolate the system from vibration and other ground effects in manners known in the art.

Figure 5:
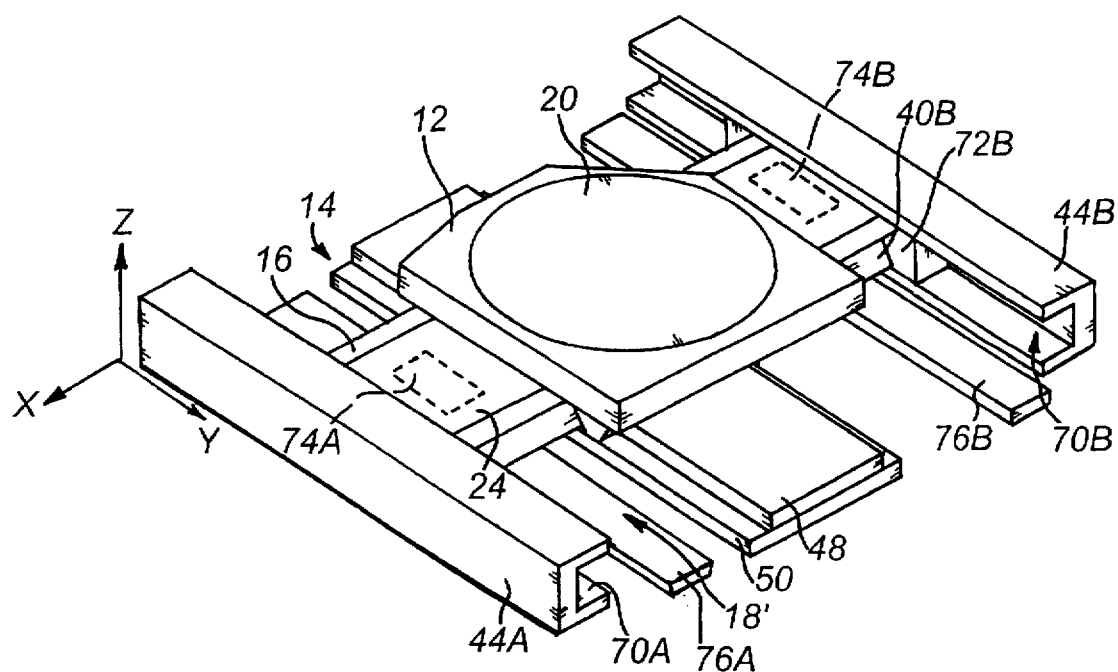
FIG. 5 is a top perspective view of a positioning system for a second embodiment of the invention which utilizes air bearings for the second subassembly.

FIG. 5 shows an alternative embodiment of the invention which is identical to that shown in FIG. 1, with the same reference numerals being used for common elements in all figures, except that air bearings have been substituted on lower subassembly 18' for the magnetic bearings utilized for the lower subassembly in FIG. 1. In particular, each of the beams 44 has standard air bearing channels 70A, 70B formed therein with a corresponding air bearing pad 72 (with only air bearing pad 72B being shown in the figure) mounted at each end of rail 16. The air bearing formed by each channel 70 and pad 72 functions in standard fashion to permit non-contact movement in the y direction under the action of the second subassembly linear motor; however, these bearings do not provide the ability to compensate for linear or rotary position errors of the stage. However, this is not required for the second subassembly since the magnetic bearings of the first subassembly are capable of compensating for positional errors in all the required dimensions (i.e. five degrees of freedom plus one degree of long travel), and, even for the embodiment of FIG. 1, the second subassembly is generally used only for long travel in the y direction. Biasing air pads 74A, 74B are provided on rail 16 at antinode points as for the electromagnets 55 in FIG. 1 and coact with air bearing surfaces 76A, 76B respectively to perform the vibration damping function. However, as shown in FIG. 5, the air bearing force is in an upward rather than a downward direction. This force could be compensated by vacuum pads as is known in the art. The embodiment of FIG. 5 otherwise functions in exactly the same manner as described above with respect to the embodiment of FIG. 1. This embodiment may be advantageous in some applications in that it is less expensive, stiffer, and easier to control. However, the air bearings make this embodiment generally unsuitable for use in vacuum or low pressure environments.

Figure 6:
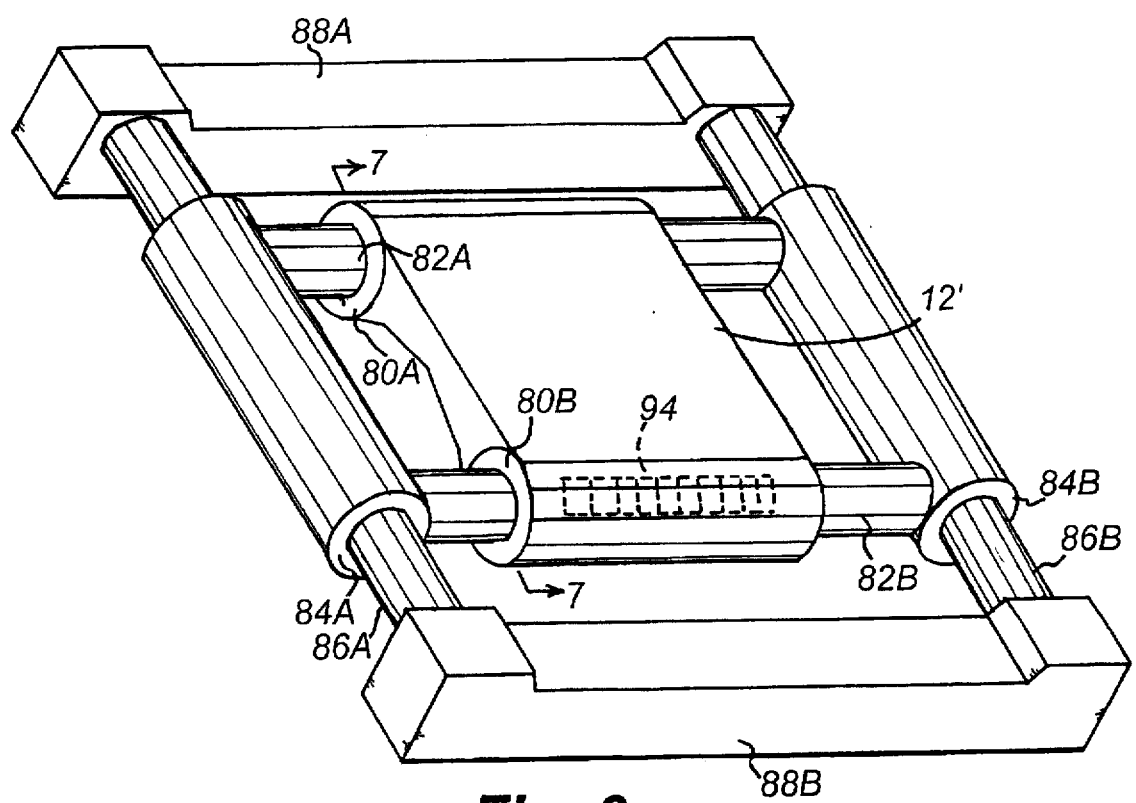
FIG. 6 is a top perspective view of a third embodiment of the invention which utilizes tubular bearings and tubular linear motors.
Figure 8:
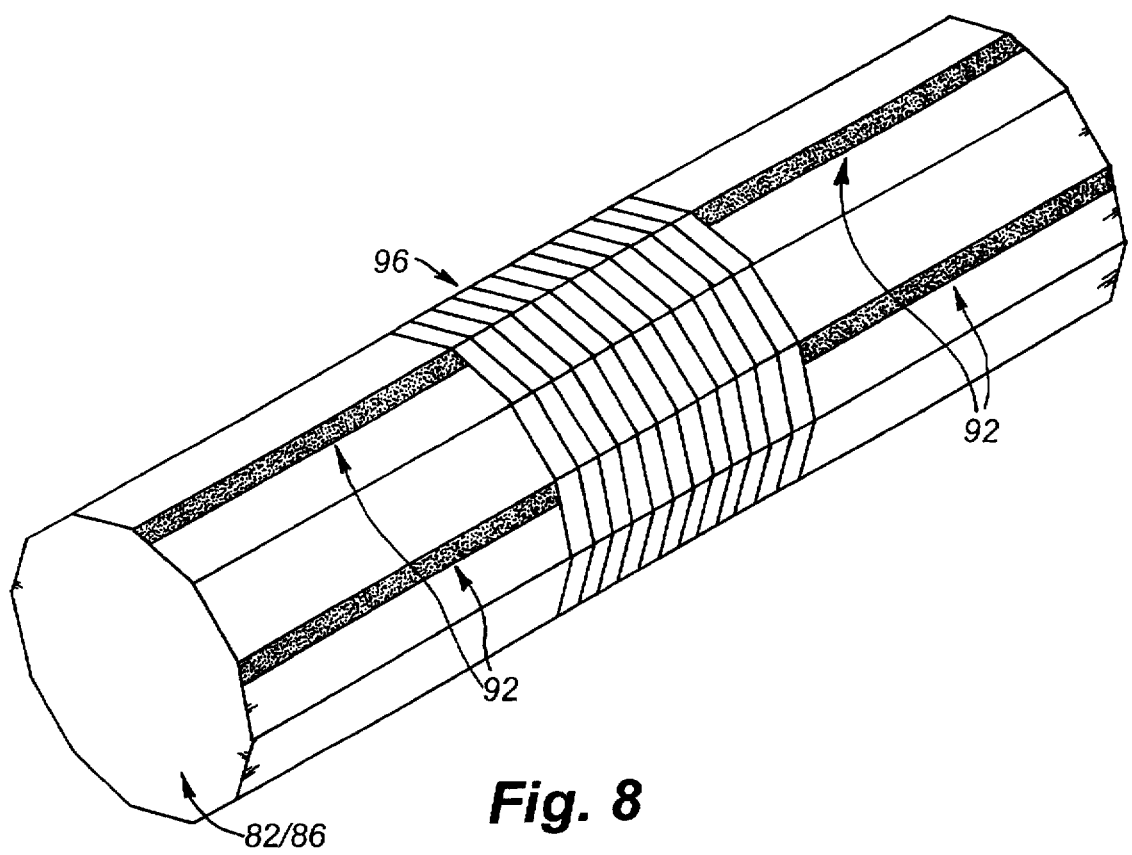
FIG. 8 is a perspective view of a section of rail suitable for use with the embodiment of the invention shown in FIG. 6.

FIGS. 6-8 illustrate another embodiment of the invention wherein tubular bearings and tubular linear motors are substituted for the corresponding bearing and motor elements of the embodiment shown in FIG. 1. In particular, the stage 12' has a tube 80A, 80B formed at each of its ends which tube fits over a corresponding rail 82A, 82B. The rails 82 are connected at one end to a tube 84A and at the other end to a tube 84B. The tubes 86A and 84B are each mounted on a corresponding rail 86A, 86B. Rails 86 are attached at one end to a support 88A and at the other end to a support 88B, with the supports 88 being mounted on a suitable base of the type described in conjunction with FIG. 1.

Each tube 80 and 84 has a bearing mounted to its inner surface adjacent each of its ends. Two possible configurations for such bearings for the first subassembly are shown in FIGS. 7A and 7B. Referring to FIG. 7A, a pair of angled actuators 90A and 90B are provided inside tube 80A and a pair of angled actuators 90C and 90D are provided inside tube 80B. Each actuator includes an electromagnet and preferably a capacitive probe, with the lower actuators 90B and 90D also including a permanent magnet. Thus, the actuators 90 are substantially the same as a single surface of an actuator 26. Similar actuators 90E and 90F are provided for tube 80A of the embodiment shown in FIG. 7B, with actuators 90G and 90H being provided for the tube 80B. The difference between the two embodiments is that the actuators for the embodiment of FIG. 7A are on the outer portion of the corresponding tube and are angled inward, while the actuators for the embodiment of FIG. 7B are on the inner portion of the corresponding tube and are angled outward. For each actuator 90, there is a corresponding target 92 formed in the corresponding rail 82, 86. Each tube 80, 84 also has a permanent magnet array 94 formed therein (with only the magnetic array 94 in the tube 80B being shown) which, as for the other magnetic arrays, is preferably a Halbach array. A short section of electrical windings 96 (FIG. 8) is formed on each rail 82, 86 in the area thereof which is covered by the corresponding tube. The length of the windings 96 is long enough so that some portion of the corresponding magnetic array 94 would always be over at least a portion of the winding, but is short enough to provide sufficient length for the targets 92 so that these targets will always underlie the corresponding bearing.

In operation, the permanent magnet portions of the bearings for each of the subassemblies support the static weight of stage 12' for the first subassembly and of stage 12' and the first subassembly for the second subassembly in substantially the same manner described for the embodiment of FIG. 1, and the electromagnets are energized to compensate for variations in the z direction and/or for rotational variations, or to cause such variations, also in the manner previously described. The tubular motors operate in substantially the manner described previously for the linear motors of FIG. 1 to effect long travel in the x and y dimensions. The four bearings of FIG. 6 result in an overconstrained situation which is generally dealt with in the system control code or sequence. Alternatively, one tube 80 or 84 of each pair may have only a single control bearing, with or without there being a linear motor for such tube.

Figure 9:
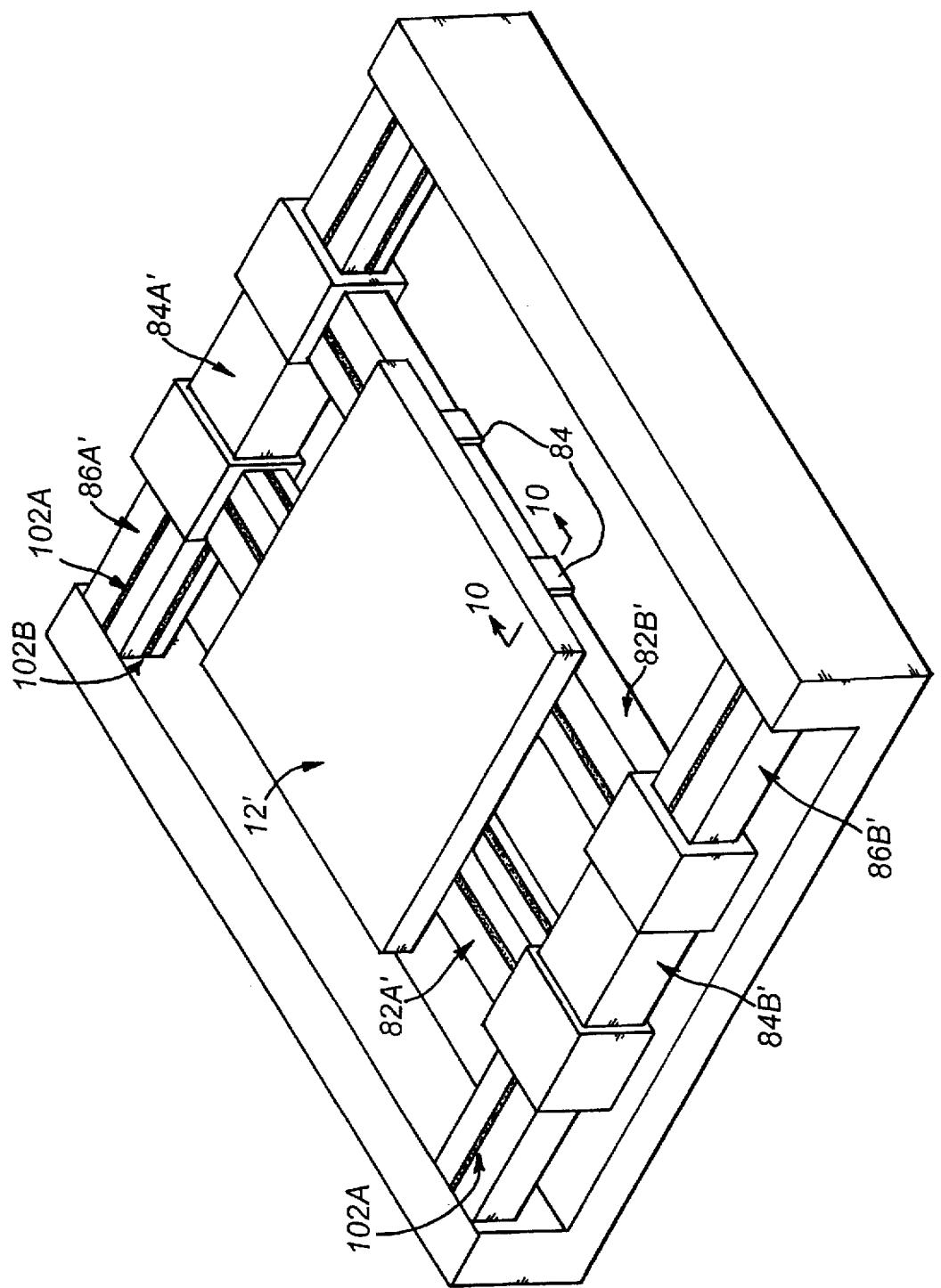
FIG. 9 is a top perspective view of a portion of a positioner embodiment utilizing square rails.
Figure 10:
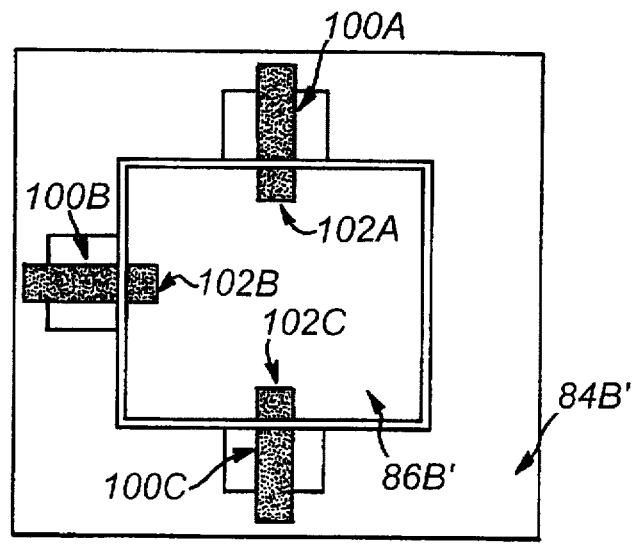
FIG. 10 is a sectional view taken along the line 10—10 in FIG. 9 of a single rail and tube and illustrating a bearing assembly.

FIG. 9 shows an alternative embodiment of the invention which differs from that shown in FIG. 6 in two respects. First, the rails 82A', 82B', 86A' and 86B' are square rather than circular, with the corresponding tubes 80A' and 80B', 84A' and 84B' also being square. The second difference is that each bearing, which is again at each end of each tube, has, as may be best seen in FIG. 10, three actuators 100A-100C mounted in a conventional perpendicular configuration rather than two angled actuators as for the FIG. 6 embodiment. A corresponding target 102A-102C is provided on the corresponding rail for each of the actuators. Assuming attractive forces between an electromagnet and its target, actuator 100A applies an upward force on the corresponding rail, actuator 100C applies a downward force and actuator 100B applies a force in the outward direction as shown in FIG. 9. Since a permanent magnet would attract to the target, a permanent magnet may be provided with the actuator 100C to support most of the static weight as for prior embodiments. Capacitive or other gap sensing probes may also be provided with selected ones of the actuators as discussed earlier.

While not shown in the figures, each tube/rail combination would contain a linear motor of the type discussed in conjunction with FIG. 6, which linear motor would provide for long travel in the x and y dimensions in the manner previously discussed in conjunction with FIG. 6, and except for the difference in the operation of the bearings, the operation of the systems for the two embodiments would be substantially the same. Tubes and corresponding rails with other cross-sectional shapes might also be utilized in appropriate applications.

Figure 11:
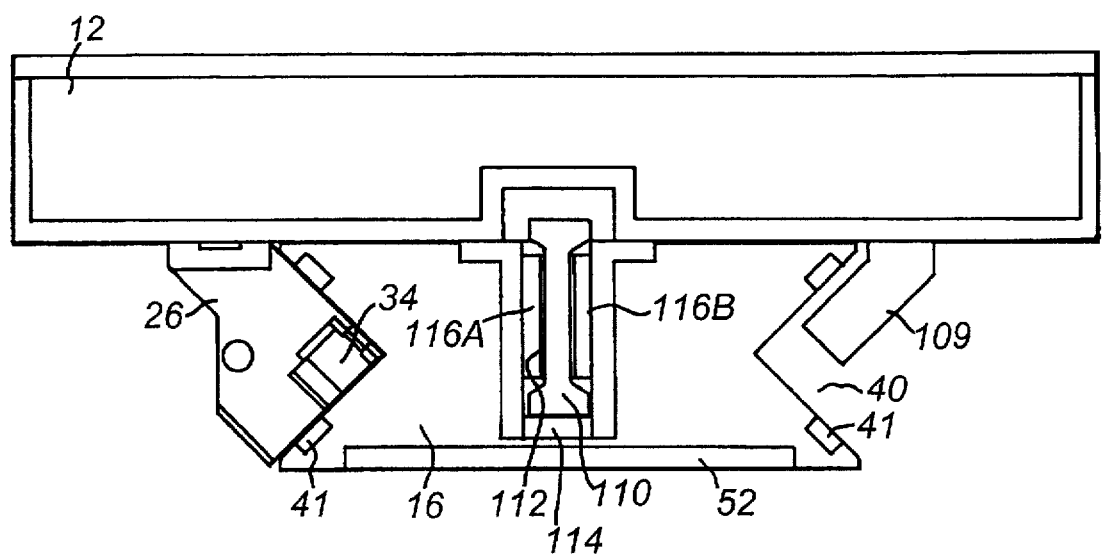
FIG. 11 is a front view of a portion of a positioner embodiment utilizing a vertical linear motor for the first subassembly.

FIG. 11 is a cutaway side view of the first subassembly of a system for an alternative embodiment of the invention utilizing a vertical driver for the first subassembly. For this embodiment, separate magnetic pods 109 are provided for vertical lift rather than having the magnets as part of actuators 26, and the stage has a vertical stator 110 projecting down from its center which stator has electrical windings 112 wrapped therearound. Electric current is selectively applied to the windings 112 to drive the stage. Stator 110 fits into a groove 112 formed along the center of rail 16, with permanent magnet arrays 116A and 116B being provided along opposite sides of the groove 114 at positions adjacent to windings 112. Thus, for this embodiment, both sides of the windings 112 are adjacent to magnetic arrays rather than one side of the windings (i.e., the top half of each winding) as for the linear motor windings 24 in FIG. 1. This arrangement provides a greater amount of drive force for the same electrical energy. Further, since the mass of stator 110 and windings 112 is substantially less than that of magnet array 22 (FIG. 2), this arrangement substantially reduces the mass of the stage, permitting faster and more responsive operation with less power consumption. As for prior embodiments, magnet arrays 116 are preferably Halbach arrays. Except for the use of a vertical motor rather a horizontal motor for the first subassembly, the embodiment of FIG. 11 is substantially the same as, and operates in substantially the same way as, the embodiment of FIG. 1.

Figure 12:
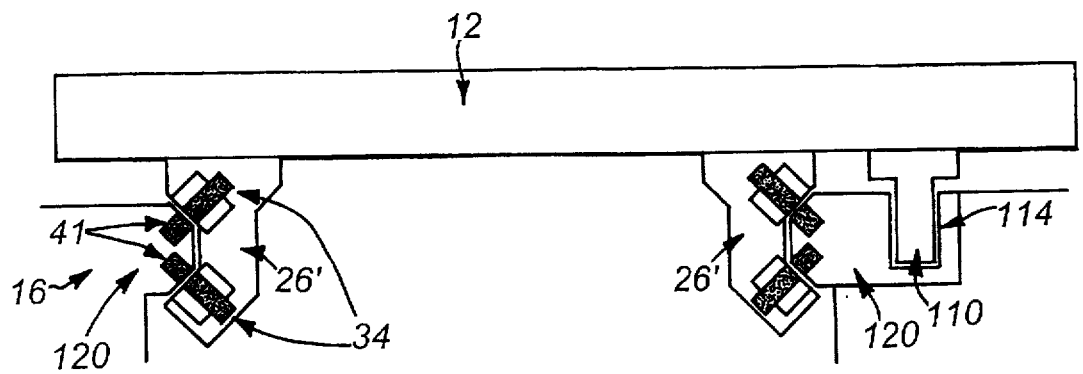
FIGS. 12 and 13 are front views of the first subassembly for two additional alternate embodiments of the invention.
Figure 13:
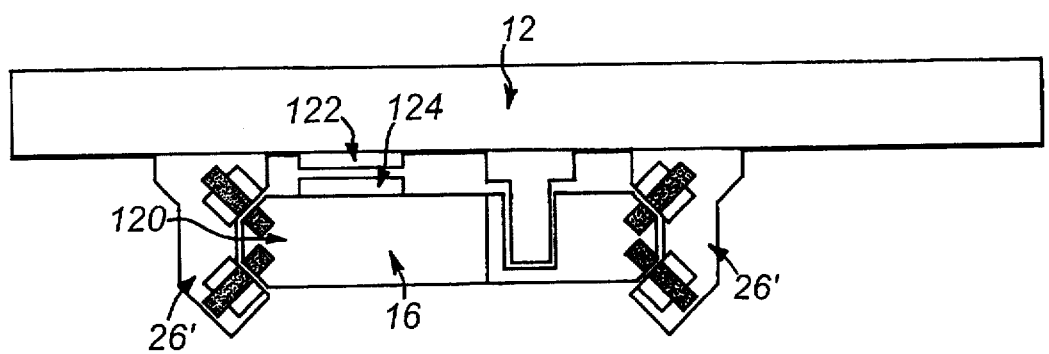

FIGS. 12 and 13 illustrate two further embodiments for the first subassembly which differ in varying ways from the embodiments shown earlier. In particular, for both embodiments, the actuators 26' differ from those shown in earlier figures in that the bearing surfaces are angled inward rather than being angled outward. However, each bearing surface contains the same compliment of electromagnets 34, and where appropriate permanent magnets 36 (and capacitive probes 38 if desired), as the bearing surfaces for the actuators 26. For the embodiment of FIG. 12, the actuators fit in a central groove formed in rail 16, with the inwardly angled actuators 26' fitting over complimentary outwardly angled projections 120 on the rail. Each projection 120 has a pair of target strips 41 extending along its length at a position opposite that of the corresponding electromagnets 34. For the embodiment of FIG. 13, the actuators 26' are inward facing, with the projections 120 being outward facing. This permits the use of a single rather than two parallel rails 16.

The embodiments of FIGS. 12 and 13 also utilize vertical motors of the type shown in FIG. 11 which motors operate in the manner previously discussed for the embodiment of FIG. 11. While the linear motor for the embodiment of FIG. 12 is shown on the right edge of the stage, the positioning shown in FIG. 13 is preferable in that it permits the center of force to substantially coincide with the center of mass for the stage.

FIG. 13 also illustrates another variation on the invention wherein, rather than using permanent magnets 136 on the actuators co-acting for example with target 41 to support the static weight of the stage, separate magnets 122 and 124 mounted to the stage 12 and rail 16, respectively, are provided to perform this function. Magnets 122 and 124 may be permanent magnets polarized to repel, which is preferred, or either one or both of the magnets may be electromagnets.

Figure 14A:
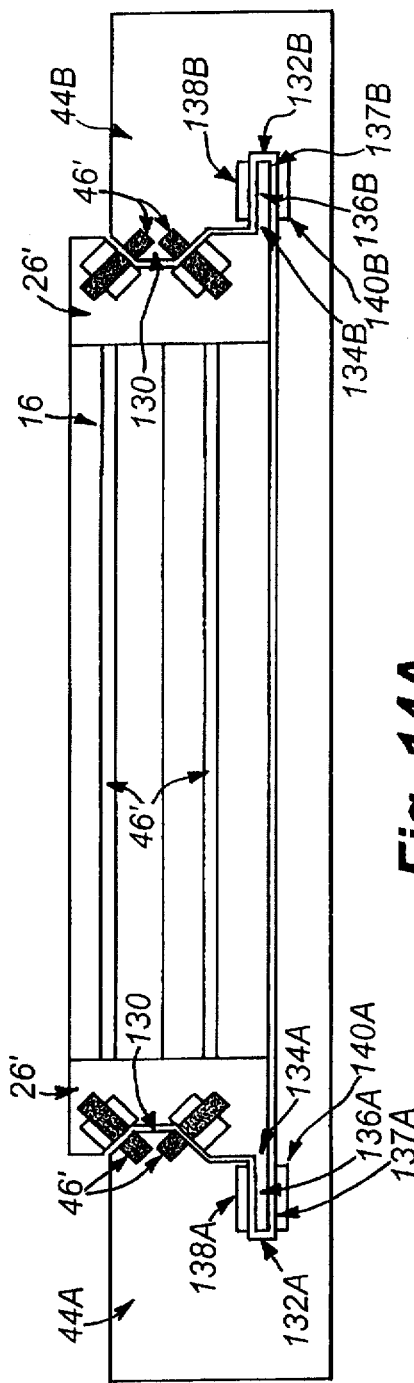
FIG. 14A is a side view of the second subassembly for another alternative embodiment of the invention.
Figure 14B:
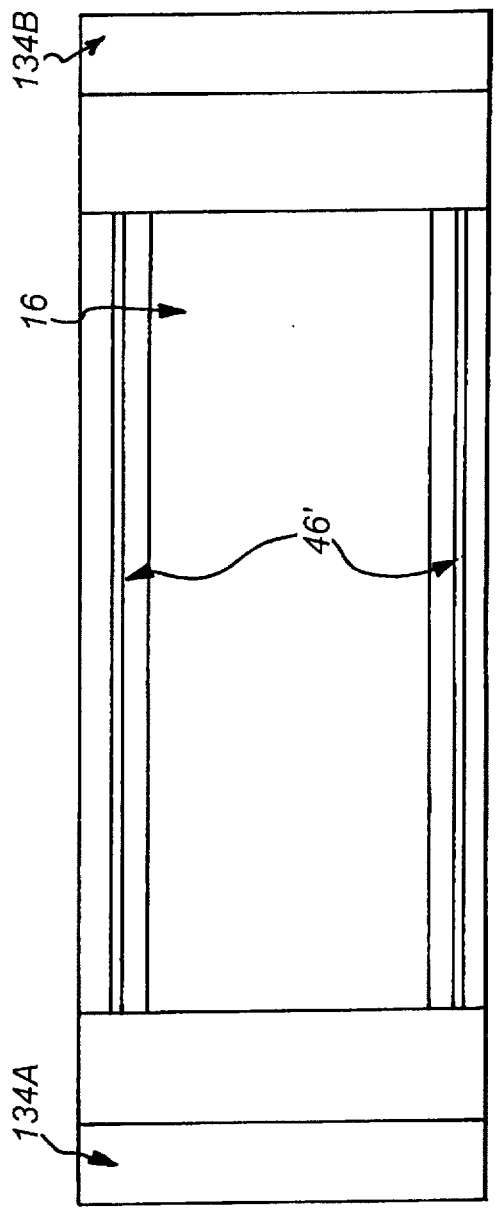
FIG. 14B is a top view of the embodiment shown in FIG. 14A.

FIG. 14 illustrates several potential variations for the second subassembly. For this embodiment, as for those shown in FIGS. 12 and 13, actuators 26' are utilized which have their bearing faces angled inward rather than outward. Supports 44 therefore have rails with projections 130 mounted thereon, with the projections 130 fitting in the channel formed in the corresponding actuator. Each projection has a pair of targets 46' extending along their length which targets are positioned opposite the corresponding electromagnets 34 of the actuator.

FIG. 14 also shows the use of more efficient linear motors for the second or lower subassembly. Each of these linear motors includes a stator 134A, 134B mounted at the end of rail 16 on which windings 136A, 136B are wound. Each stator 134 fits in a corresponding groove 137 in the corresponding support 44. A pair of permanent magnet arrays 138A, 140A are provided on either side of groove 137A and a pair of permanent magnet arrays 138B and 140B are provided on either side of groove 137B, which permanent magnets operate in conjunction with the winding 136 to drive the second subassembly of the system. This drive is more efficient than that shown in FIG. 1 in that it utilizes both sides of the windings 136 rather than only one side, requiring less energy to generate the same drive forces.

Figure 15A:
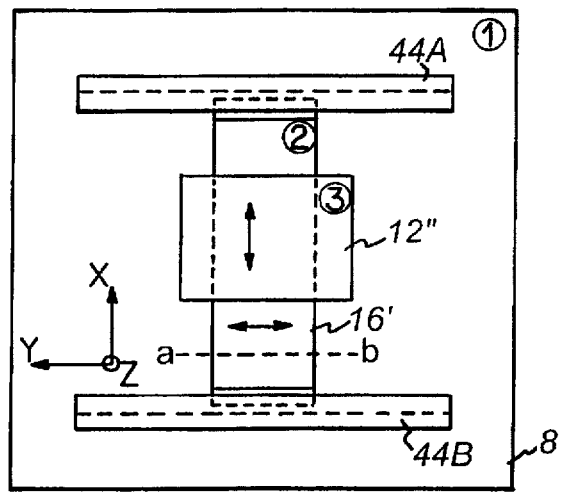
FIGS. 15A and 15B are a top view and a side sectional view respectively for another embodiment of the invention.
Figure 15B:
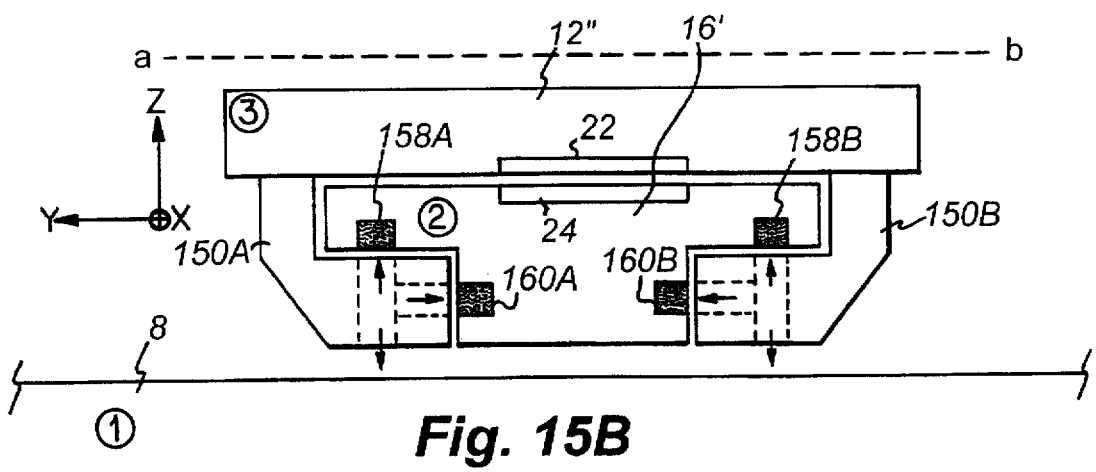
Figure 15C:
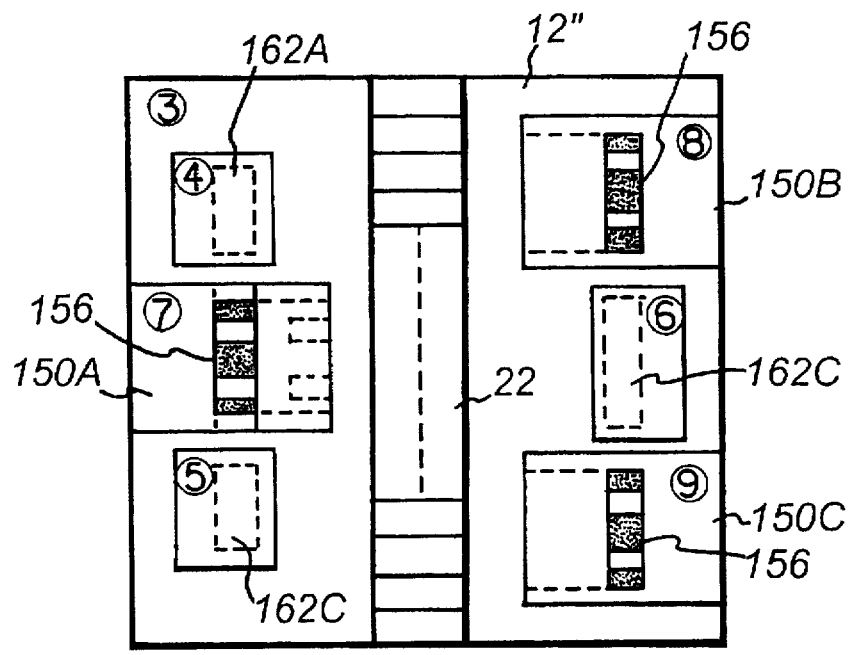
FIG. 15C is a bottom view of the stage for the embodiment of FIG. 15A.
Figure 16:
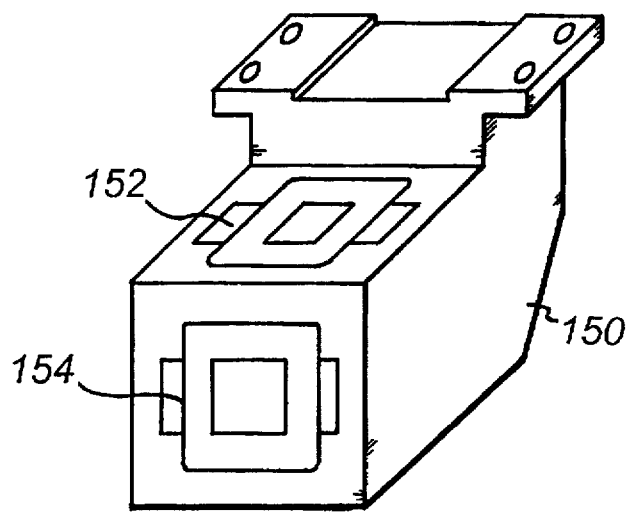
FIG. 16 is a perspective view of an actuator suitable for use as the actuators of FIGS. 15B and 15C.

FIGS. 15A–15C and 16 show an embodiment of the invention wherein the stage 12" has three actuators 150A–150C extending from its underside. As best seen in FIG. 15B, rail 16' has a "t" shape, with each actuator 150 extending around and under a corresponding upper portion of the rail. Each actuator 150 has an upper electromagnet 152 which coacts with a corresponding ferrous or other magnetic strip 158A–158B in a portion of the rail above the actuator; a front electromagnet 154 which coacts with a corresponding ferrous strip 160A–160B in the trunk of the rail and a lower electromagnetic actuator 156 (FIG. 15C) which coacts with the top of base 8, with either the entire base 8 or at least a portion thereof under the electromagnets 156 being of a ferrous material. Permanent magnets 162A–162C are also provided which support the stage weight, or at least most of the stage weight, in substantially the same way that permanent magnets have been used to support the weight of the stage for prior embodiments. These permanent magnets coact with the same ferrous elements as the electromagnets 152. A magnetic array 22 is also provided on the underside of stage 12" which coacts with linear motor windings 24 on rail 16' to move the stage in the X direction in the same manner that these elements operate to perform the drive function for the embodiment of, for example, FIG. 1. Finally, the ends of rail 16' are supported in bearings 44A–44B which are preferably air bearings such as those shown in FIG. 5, but may also be magnetic bearings of the type shown in FIG. 1.

The advantage of the embodiment shown in FIGS. 15A–15C and FIG. 16 is that the electromagnets 152 coacting with the strips 158 provide a controllable bias force which decouples the two stages of the system, and in conjunction with a control force provided by the electromagnets 156 coacting with base 8 serve to damp any possible vibrations of the rail. The control force $F_c$ acts against the solid base 8 to perform this function and also to offset the bias force $F_b$, which is typically a constant force and to maintain desired position of the stage in z direction. In particular, the current in an electromagnet 156 is increased to move the stage down against the action of the bias force $F_b$ and is decreased to permit the stage to move slightly upward under the action of $F_b$. Since in some applications the bias force provided by electromagnets 156 is a substantially constant force, in such applications permanent magnets may sometimes be substituted for the electromagnets 156 (for example, magnets 162 might be adjusted to perform both the weight support and the bias function).

Figure 17A:
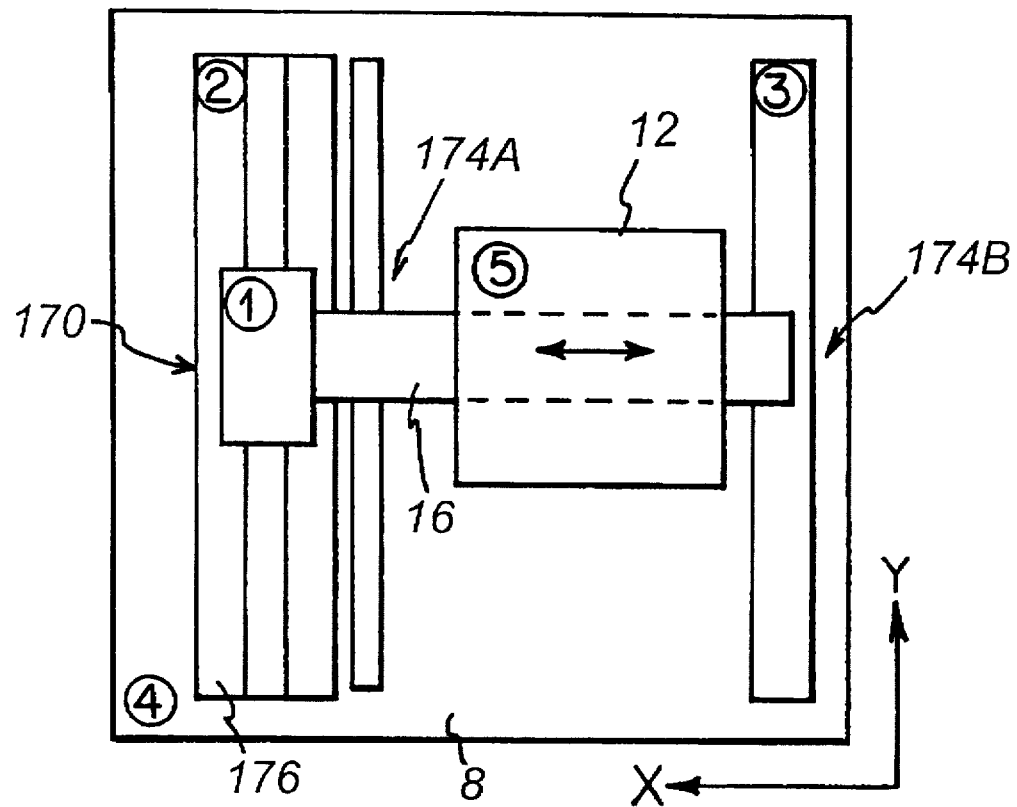
FIGS. 17A and 17B are a top view and a side view, respectively, for a final embodiment of the invention.
Figure 17B:
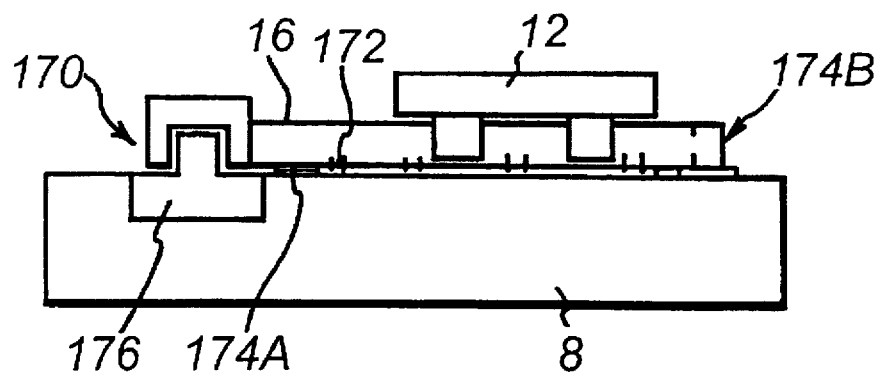

Referring now to FIGS. 17A and 17B, an embodiment of the invention is shown which is similar to the embodiment of the invention shown in FIG. 5 wherein air bearings are used for the second subassembly, but differs in that an air bearing 170 is provided only on the left hand side of beam 16 for the second subassembly, but a bearing is not provided on the right hand side of rail 16. Instead, orifices 172 are provided in the rail 16 through which air is pumped so that the rail along its length functions as an air bearing. A linear drive or motor 174A, 174B is provided on each end of rail 16. Except as indicated above, the structure of the embodiment shown in FIGS. 17A and 17B is substantially the same as was described for previous embodiments, for example the embodiments shown in FIGS. 1 and 5.

The advantage of the embodiment shown in FIGS. 17A and 17B is that prior embodiments require that the bearing rails 44A and 44B be parallel with fairly high tolerances. Achieving these tolerances can be difficult and expensive and failure to assemble the rails absolutely parallel could result in distorting forces being applied to the rail 16. With the embodiment shown in FIGS. 17A and 17B, there is a bearing rail 176 on only one side, with the right side of rail 16 being unconstrained, being supported in a vertical direction by the air pumped through ports 172. Since both linear motors 174 have standard positional feedback, any rotation of rail 16 about a vertical axis passing for example through bearing 170 can be controlled by the linear drives. As indicated previously, the bearings of the second subassembly are not involved for air bearing embodiments in compensating for other types of positional errors.

Although a large number of embodiments have been described above, these embodiments have been presented for purposes of illustration only and features of the various embodiments may be combined in ways other than those shown or various additional modifications may be made in the various embodiments.

Thus, while the invention has been particularly shown and described above with reference to preferred embodiments, the foregoing and other changes in form and detail may be made therein by those skilled in the art without departing from the spirit and scope of the invention.

What is claimed is:

1. A positioning system for providing precise positioning of a stage in three linear and three rotary dimensions, with long travel in two linear ones of said dimensions comprising:
    a first magnetic subassembly for moving the stage to a selected position in a first one of the linear dimensions for which there is long travel, in said three rotary dimensions and for short travel in at least one other linear dimension; and
    a second subassembly for moving the first subassembly, including the stage which is mounted to the first subassembly, to a selected position in the second one of the linear dimensions for which there is long travel, drive and bearing elements for the second subassembly being non-contact elements so that there is substantially no physical contact between elements of the first subassembly and elements of the second subassembly which move relative to each other.

2. A positioning system as claimed in claim 1 wherein the bearing elements for the second subassembly are air bearings.

3. A positioning system as claimed in claim 1 wherein the bearing elements for the second subassembly are magnetic bearings.

4. A positioning system as claimed in claim 1 wherein said stage is in a plane, with the two dimensions for which long travel occurs being parallel to said plane and substantially perpendicular to each other, wherein each subassembly has at least two magnetic bearings, and wherein the magnetic bearings for at least one of said subassemblies each contain at least two electromagnets which are mounted at angles such that the electromagnets provide equal forces in the same direction in a plane parallel to said plane and equal but opposite forces in a plane perpendicular to said plane.

5. A positioning system as claimed in claim 4 wherein at least one of said electromagnets for each bearing is at a 45° angle to said plane.

6. A positioning system as claimed in claim 4 wherein said stage has a static weight when unloaded, and wherein said magnetic bearings include at least one permanent magnet angled at substantially the same angle as one of the electromagnets of the bearing, the permanent magnets supporting a selected portion of said static weight.

7. A positioning system as claimed in claim 4 wherein the angles of said electromagnets are such that the forces in the direction perpendicular to said plane are greater than the forces in the parallel direction.

8. A positioning system as claimed in claim 4 wherein the electromagnets for the bearings of the first subassembly are selectively energized to make fine position adjustments for the stage in the four dimensions for which the system does not provide long travel.

9. A positioning system as claimed in claim 4 wherein each subassembly has three bearings.

10. A positioning system as claimed in claim 3 wherein two substantially parallel rails are provided for each subassembly, the rails for the first subassembly each being sized and shaped to fit, with a selected clearance, in a corresponding one of a pair of spaced parallel tubes associated with the stage and the rails for the second subassembly each being sized and shaped to fit, with a selected clearance, in a corresponding one of a pair of spaced parallel tubes associated with the first subassembly, each of said tubes having at its ends at least two electromagnetic bearing elements, there being targets for the bearing elements formed on the corresponding rails, and a co-acting pair of electromagnetic linear drive elements formed respectively on the inner surface of each tube and the outer surface of each rail on a portion of the rail overridden by the corresponding tube.

11. A positioning system as claimed in claim 10 wherein there are two electromagnetic bearing elements at the end of each tube, which elements are mounted at an angle to the plane of the stage so as to provide forces in both a direction parallel to and in a direction perpendicular to the plane of the stage.

12. A positioning system as claimed in claim 10 wherein the electromagnetic linear drive elements include a coacting array of permanent magnets on one of the inner surface of each tube and the outer surface of each rail and a length of electrical windings on the other of the tube/rail.

13. A positioning system as claimed in claim 12 where the array of permanent magnets for each tube are a Halbach array.

14. A positioning system as claimed in claim 3 including a gap measuring probe mounted in at least selected ones of said magnetic bearings.

15. A positioning system as claimed in claim 14 wherein each bearing contains at least two electromagnets, each of which electromagnets has a bearing surface, and wherein a probe is mounted in at least selected ones of said electromagnets, with a measuring face of the probe flush with the bearing surface of the electromagnet.

16. A positioning system as claimed in claim 15 wherein said probes are capacitive probes.

17. A positioning system as claimed in claim 14 wherein the probes for the first subassembly are mounted to the stage; and including circuitry on the stage to process electrical outputs from each probe mounted thereon so that the resultant signal is above noise levels.

18. A positioning system as claimed in claim 1 wherein each of said subassemblies includes a linear motor for moving the subassembly in its long travel dimension.

19. A positioning system as claimed in claim 18 wherein at least one of said linear motors is an electromagnetic motor having a permanent magnet array mounted to one of a moving member and a stationary member for each subassembly and windings mounted to the other of the members for each subassembly at a position adjacent the corresponding permanent magnet array.

20. A positioning system as claimed in claim 19 wherein the permanent magnet array for the at least one electromagnetic motor is a Halbach array.

21. A positioning system as claimed in claim 18 wherein at least one of the linear motors is an electromagnetic motor having a stator with windings thereon mounted to one element of the corresponding subassembly and a pair of magnet arrays, one on each side of the stator, mounted to the other element of the subassembly.

22. A positioning system as claimed in claim 21 wherein the stator for the linear motor of the first subassembly projects downward from the bottom of the stage at an angle substantially perpendicular to the plan of the stage, and wherein the magnet arrays are mounted to the other element of the first subassembly in a position so as to be on opposite sides of the stator.

23. A positioning system as claimed in claim 1 wherein the second subassembly includes a rail on which the first subassembly is mounted, the rail being supported at its ends by bearing elements; and means for damping structural resonance of said rail and interactions between the subassemblies.

24. A positioning system as claimed in claim 23 wherein said means for damping includes means for providing a coupling force to said rail in at least one point between said ends.

25. A positioning system as claimed in claim 24 wherein said at least one point where a coupling force is applied to the rail are antinodes for structural resonance of the rail.

26. A positioning system as claimed in claim 24 wherein said means for providing coupling force includes electromagnetic bearing elements mounted to said rail at each of said points, and corresponding target elements mounted to a frame for said system.

27. A positioning system as claimed in claim 24 wherein said means for providing coupling force includes air bearing elements mounted to said rail at each of said points, and corresponding target elements mounted to a frame for said system.

28. A positioning system as claimed in claim 23 wherein the linear dimension for short travel is the vertical dimension; and wherein said means for damping includes means for generating a substantially constant bias force to decouple the stages, and means for generating a control vertical force referenced to a fixed base for both damping and vertical control.

29. A positioning system as claimed in claim 28 wherein said first subassembly includes at least three actuators, each of which extends from the underside of the stage and extends under the rail so as to sit between the rail and said fixed base, electromagnetic means in the top of each actuator and coacting with a corresponding magnetic element in the underside of the rail to generate said constant bias force, and electromagnet means in the bottom of each actuator and coacting with magnetic means forming at least part of said base to generate said control vertical force.

30. A positioning system as claimed in claim 1 wherein there is an air bearing of the second subassembly at one end of the first subassembly and air support along the first subassembly, but wherein the end of the first subassembly opposite said one end is unconstrained.

31. In a positioning system for a stage which utilizes magnetic bearings to control the position of the stage in at least selected dimensions, each of said magnetic bearings including a pair of bearing surfaces defining a bearing gap and an electromagnetic element positioned in and flush with the one of said bearing surfaces mounted to the stage, a probe mechanism for detecting bearing gap for at least selected ones of the bearings comprising:

a probe element for each of said selected bearings positioned in and mounted flush with the same bearing surface as the corresponding electromagnetic element; and circuitry mounted to the stage for receiving outputs from said probe elements and for processing said outputs in a manner which results in output levels from the circuitry which are significantly greater than the output levels from the probe elements.

32. A probe mechanism as claimed in claim 31 wherein said probe element is a capacitive probe element.

* * * * *

UNITED STATES PATENT AND TRADEMARK OFFICE
CERTIFICATE OF CORRECTION

PATENT NO. : 5,699,621
DATED : December 23, 1997
INVENTOR(S) : David L. Trumper, et. al.

It is certified that error appears in the above-identified patent and that said Letters Patent is hereby corrected as shown below:

Title page,

The first line under the heading "Field Of The Invention" should read:

This invention was sponsored by Sandia National Laboratories under Prime Contract Number DC-AC04-94AL8500 with the U.S. Department of Energy. The government has certain rights in the invention.

Signed and Sealed this

Seventh Day of April, 1998

Attest:

BRUCE LEHMAN

Attesting Officer

Commissioner of Patents and Trademarks